(12) United States Patent
Ueda et al.

(10) Patent No.: US 12,275,594 B2
(45) Date of Patent: Apr. 15, 2025

(54) ARTICLE TRANSPORT FACILITY

(71) Applicant: Daifuku Co., Ltd., Osaka (JP)

(72) Inventors: Toshihito Ueda, Hinocho (JP); Tatsuki Ii, Hinocho (JP); Akira Suzuki, Hinocho (JP); Tomoaki Nishikawa, Hinocho (JP); Shota Inden, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 145 days.

(21) Appl. No.: 18/224,166

(22) Filed: Jul. 20, 2023

(65) Prior Publication Data

US 2024/0025657 A1 Jan. 25, 2024

(30) Foreign Application Priority Data

Jul. 25, 2022 (JP) .................................. 2022-118278
Mar. 6, 2023 (JP) .................................. 2023-033695

(51) Int. Cl.
*B65G 35/06* (2006.01)
*B65G 43/10* (2006.01)

(52) U.S. Cl.
CPC ............. *B65G 35/06* (2013.01); *B65G 43/10* (2013.01); *B65G 2203/0283* (2013.01); *B65G 2203/0291* (2013.01)

(58) Field of Classification Search
CPC B65G 37/02; B65G 17/20; B65G 2203/0283; B65G 2203/04; B61B 3/02
USPC ....................................................... 198/463.1
See application file for complete search history.

(56) References Cited

U.S. PATENT DOCUMENTS

| 10,196,214 | B2 * | 2/2019 | Motoori | B61K 1/02 |
| 2017/0008700 | A1 * | 1/2017 | Wada | B61B 3/02 |
| 2018/0229936 | A1 * | 8/2018 | Motoori | B65G 1/065 |
| 2021/0331708 | A1 * | 10/2021 | Takahara | B60W 60/0027 |

FOREIGN PATENT DOCUMENTS

JP 2006313463 A 11/2006

\* cited by examiner

*Primary Examiner* — Gene O Crawford
*Assistant Examiner* — Lester Rushin, III
(74) *Attorney, Agent, or Firm* — The Webb Law Firm

(57) ABSTRACT

An article transport facility includes a transport vehicle and a segment controller. When the transport vehicle is to travel on a first route section, the transport vehicle requests first passage permission, which is passage permission to travel past a first passage location, from the segment controller. When the transport vehicle is to travel on a second route section, the transport vehicle requests second passage permission, which is passage permission to travel past a second passage location, from the segment controller. In response to the request for both the first passage permission and the second passage permission, the segment controller, if the first passage location and the second passage location are both unoccupied by preceding transport vehicles, permits the transport vehicle to travel from the first route section or second route section into a connecting route section and to occupy both the first passage location and the second passage location.

6 Claims, 11 Drawing Sheets

Fig.6
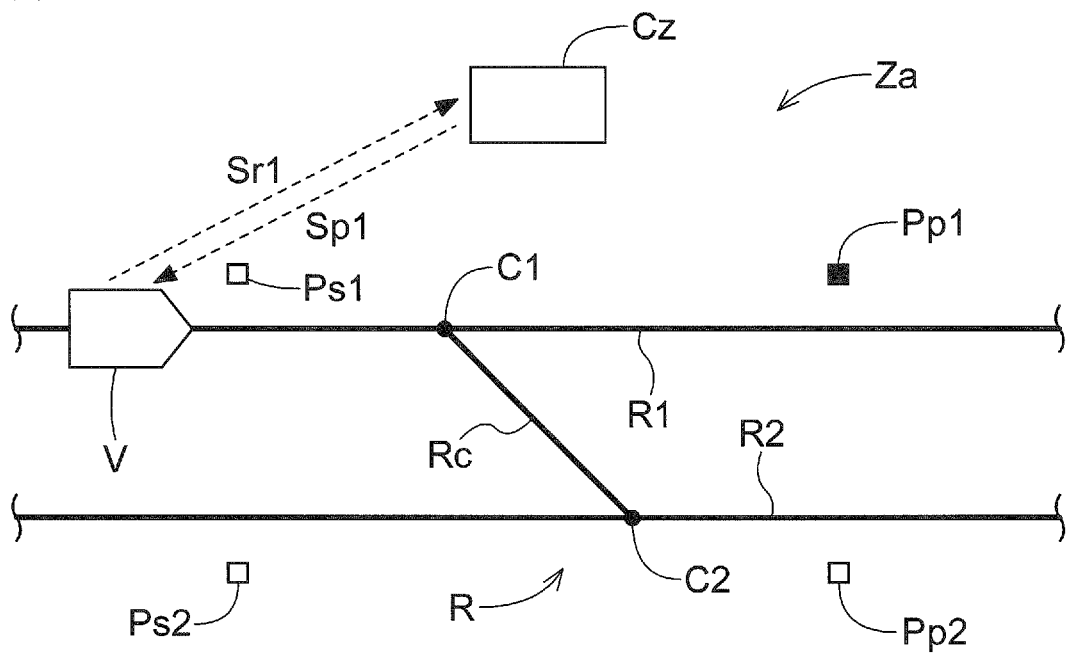
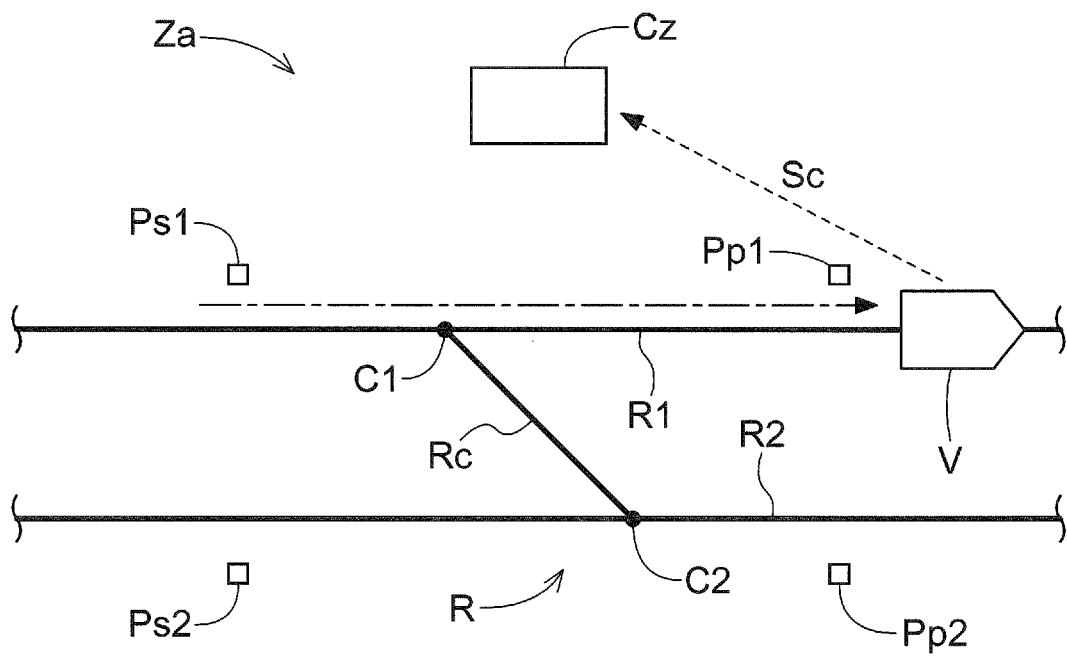

Fig.7
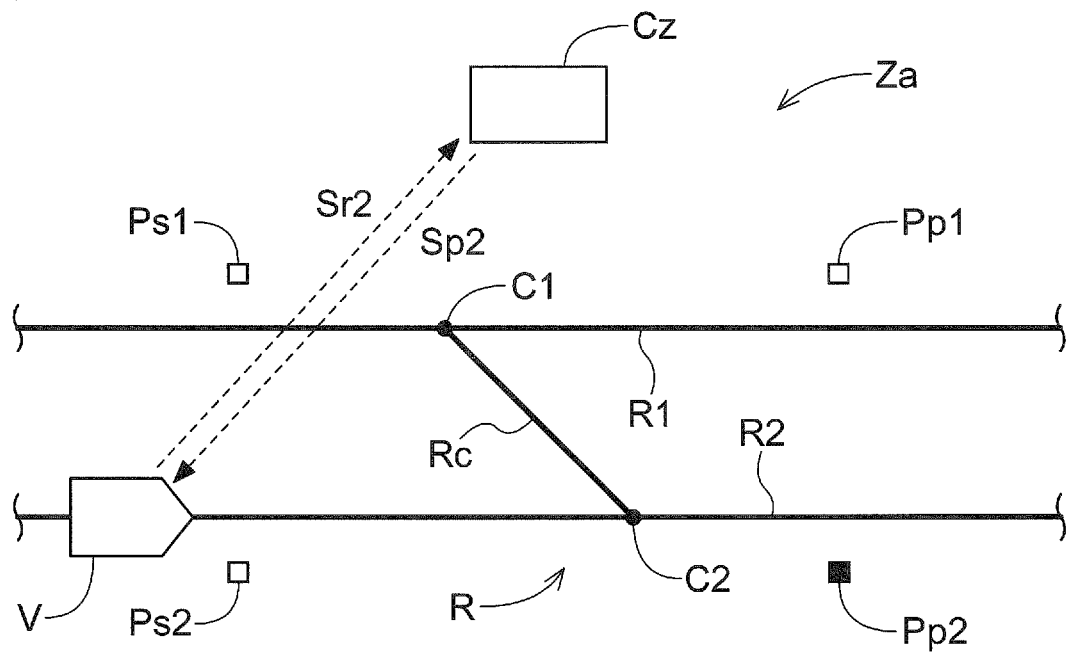
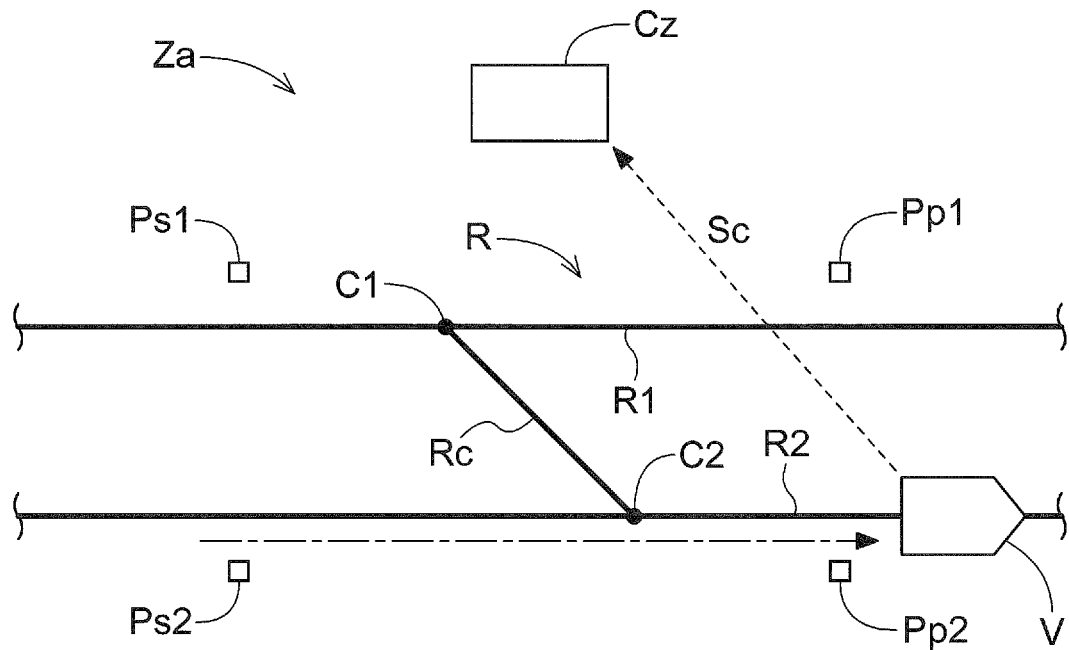

Fig.8
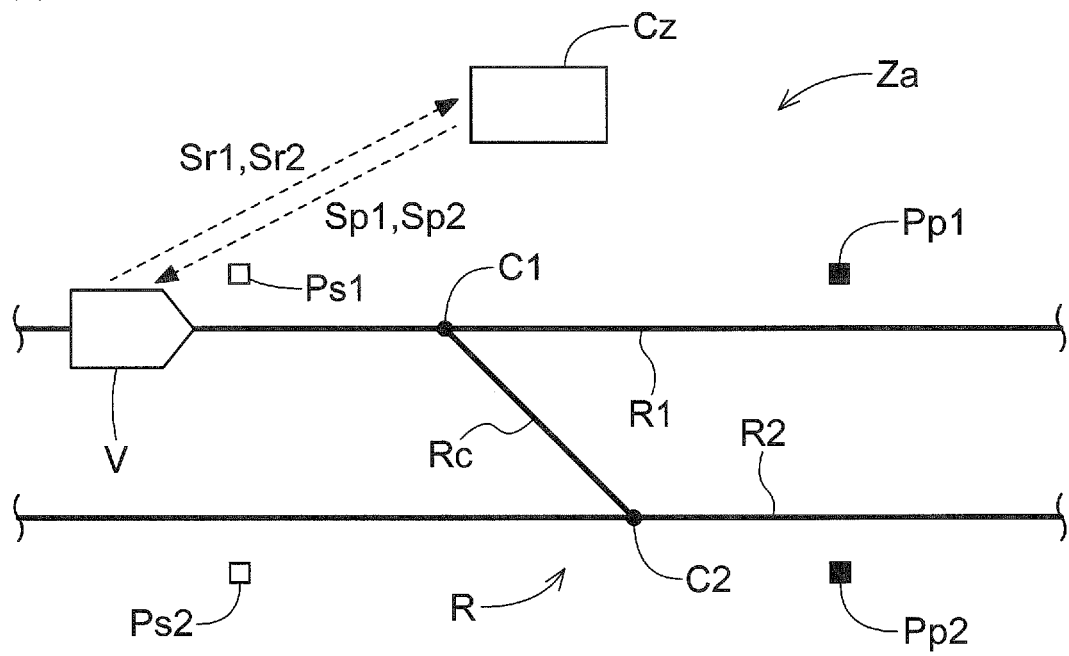
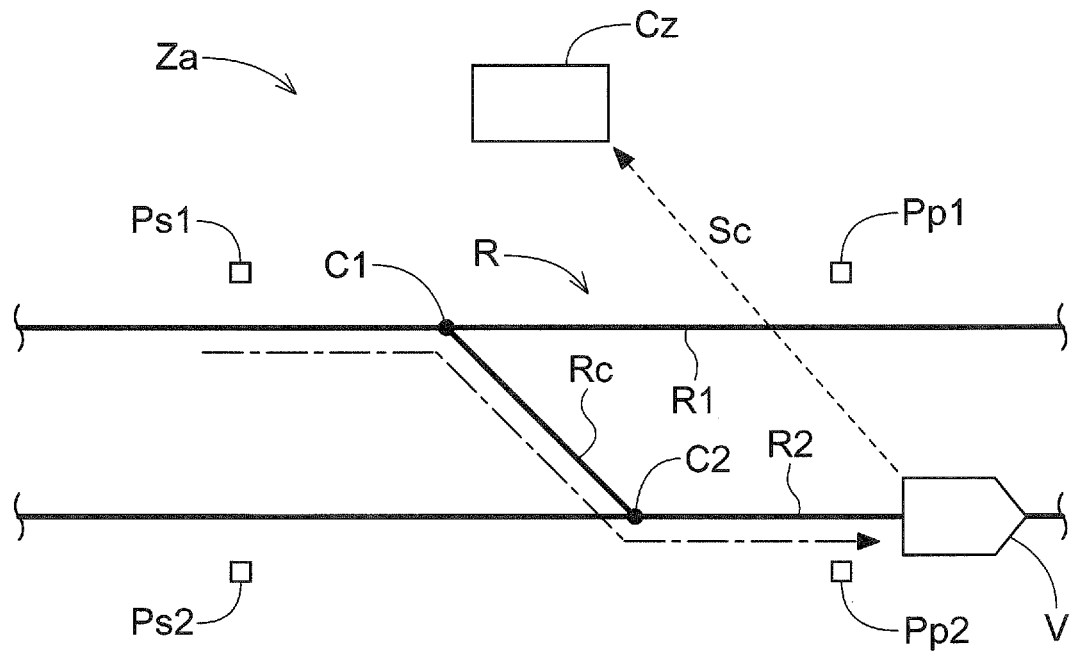

Fig.9
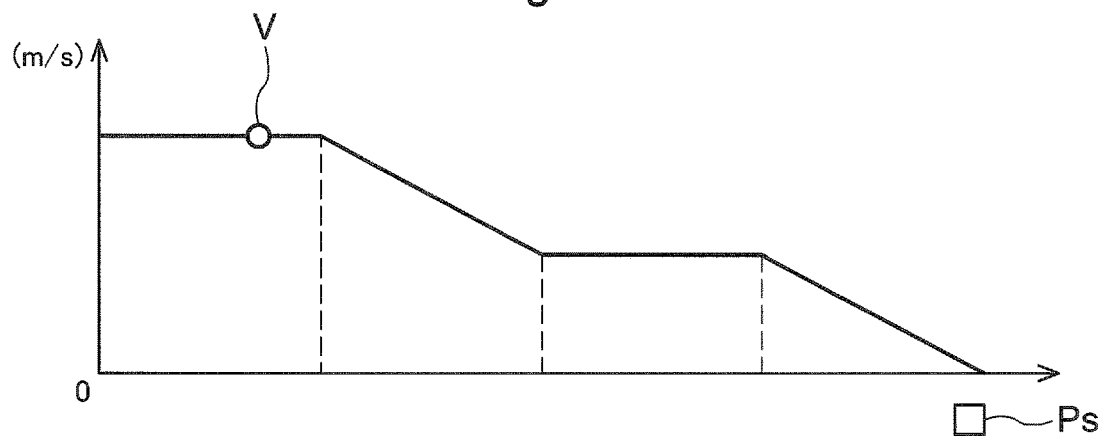
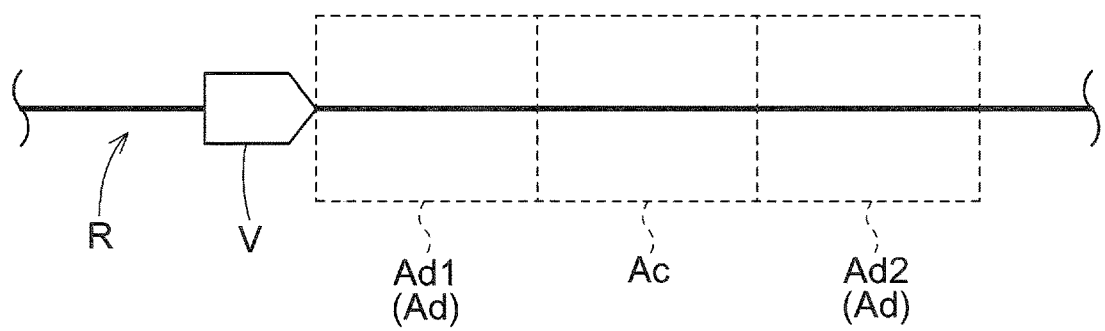
Fig.10
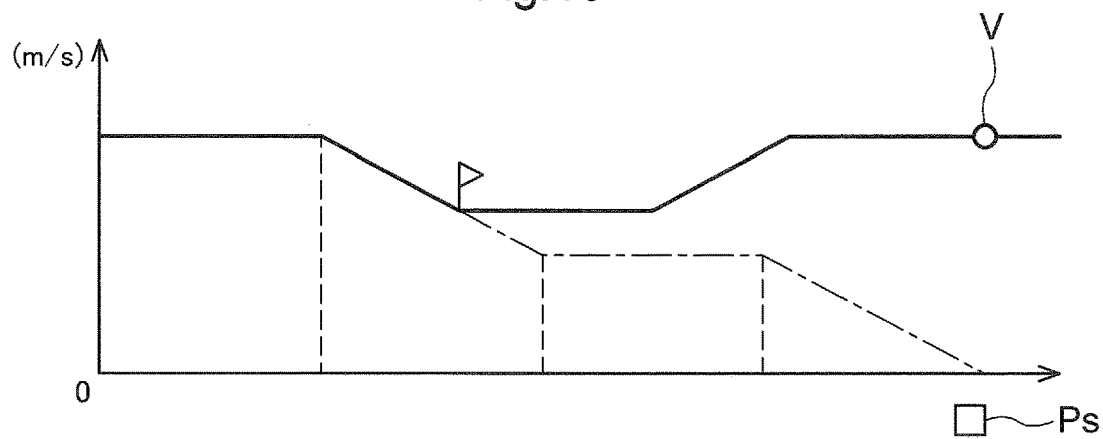
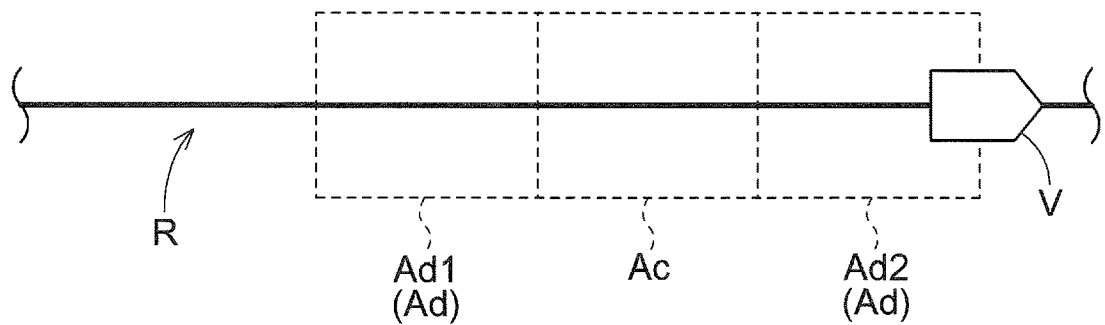

ARTICLE TRANSPORT FACILITY

CROSS-REFERENCE TO RELATED APPLICATION

This application claims priority to Japanese Patent Application Nos. 2022-118278 filed Jul. 25, 2022 and 2023-033695 filed Mar. 6, 2023, the disclosures of which are hereby incorporated by reference in their entireties.

BACKGROUND OF THE INVENTION

Field of the Invention

The present invention relates to an article transport facility including a transport vehicle configured to transport an article, a travel route on which the transport vehicle travels, and a segment controller configured to give passage permission to the transport vehicle traveling in a particular segment and control the transport vehicle, the particular segment covering a particular portion of the travel route.

Description of Related Art

Japanese Unexamined Patent Application Publication, Tokukai, No. 2006-313463 (Patent Literature 1) discloses an example of the above article transport facility as a transport carriage system. The description below in the Background Art section shows reference signs in parentheses to indicate those used in Patent Literature 1.

The system disclosed in Patent Literature 1 has a lock point at a branching or merging portion of a travel route for a transport vehicle (5), and determines for each segment that includes such a lock point (hereinafter referred to as "control segment") whether to permit the transport vehicle (5) to travel past the lock point.

The transport vehicle (5), before entering a control segment (which includes lock point), transmits to a zone controller (11) a blocking request for requesting the zone controller (11) to prohibit other transport vehicles (5) from entering the control segment. If the zone controller (11) permits the transport vehicle (5) (which has transmitted the blocking request to the zone controller (11)) to travel through the control segment, the zone controller (11) accepts the blocking request and prohibits other transport vehicles (5) from traveling through the control segment. After the transport vehicle (5) has traveled through the control segment, the zone controller (11) stops blocking the control segment to be able to receive another transport vehicle (5).

The system disclosed in Patent Literature 1 determines for each control segment whether to permit the transport vehicle (5) to travel past the lock point. This means that a single control segment is unable to receive two or more transport vehicles (5) at the same time, which leads to inefficiency in transport vehicles traveling through such a control segment. If the article transport facility has a large number of similar control segments, the article transport facility is limited in terms of improvement in the overall transport efficiency.

SUMMARY OF THE INVENTION

The above circumstances have led to a demand for an article transport facility that allows transport vehicles to travel efficiently through a segment of a travel route which segment covers a branching or merging portion and that thereby enjoys improvement in the overall transport efficiency.

To attain the above object, an article transport facility according to the present invention includes:
a transport vehicle configured to transport an article;
a travel route on which the transport vehicle travels; and
at least one segment controller configured to give passage permission to the transport vehicle traveling in a particular segment and control the transport vehicle, the particular segment covering a particular portion of the travel route,
wherein the particular segment covers:
  a first route section;
  a second route section that does not intersect with the first route section; and
  a connecting route section connecting a first connection on the first route section with a second connection on the second route section,
the first route section and the second route section are each a route section on which the transport vehicle travels in a single direction from upstream to downstream,
the first route section has a first passage location downstream from the first connection,
the second route section has a second passage location downstream from the second connection,
in a case where the transport vehicle travels past the first connection on the first route section,
  the transport vehicle requests first passage permission from the at least one segment controller at a position upstream from the first connection, the first passage permission being the passage permission to travel past the first passage location,
  in response to receiving the first passage permission, the transport vehicle travels past the first connection toward the first passage location, and
  in response to failing to receive the first passage permission, the transport vehicle stops upstream from the first connection,
in a case where the transport vehicle travels past the second connection on the second route section,
  the transport vehicle requests second passage permission from the at least one segment controller at a position upstream from the second connection, the second passage permission being the passage permission to travel past the second passage location,
  in response to receiving the second passage permission, the transport vehicle travels past the second connection toward the second passage location, and
  in response to failing to receive the second passage permission, the transport vehicle stops upstream from the second connection,
in a case where the at least one segment controller has given the first passage permission to the transport vehicle, the at least one segment controller permits the transport vehicle to occupy the first passage location associated with the first passage permission,
in a case where the at least one segment controller has given the second passage permission to the transport vehicle, the at least one segment controller permits the transport vehicle to occupy the second passage location associated with the second passage permission,
in a case where the transport vehicle travels from the first route section or second route section into the connecting route section, the transport vehicle requests both the first passage permission and the second passage permission from the at least one segment controller,
in response to the request for both the first passage permission and the second passage permission, the at least one segment controller, if the first passage location and the second passage location are both unoccupied by preceding transport vehicles, permits the transport vehicle to travel from the first route section or second route section into the connecting route section and to occupy both the first passage location and the second passage location.

The particular segment covers a first route section and a second route section that does not intersect with the first route section. The particular segment thus allows different transport vehicles to travel concurrently on the first and second route sections if no transport vehicle travels through the connecting route section. The above configuration makes it possible to determine whether to permit a transport vehicle to travel past the first passage location on the first route section or the second passage location on the second route section individually. This allows two or more transport vehicles to travel concurrently on the first and second route sections if those transport vehicles are to travel not through the connecting route section. This in turn allows transport vehicles to travel through a particular segment efficiently as compared to a case of a segment controller determining whether to permit a transport vehicle to pass through all passage locations in a particular segment. In a case where a transport vehicle travels from the first route section through the connecting route section into the second route section or from the second route section through the connecting route section into the first route section, the segment controller, if the first and second passage locations are both unoccupied by other preceding transport vehicles, permits the transport vehicle to travel as intended and occupy both the first and second passage locations. This prevents two or more transport vehicles from coming into contact with one another in a particular segment, and also improves the overall transport efficiency of the article transport facility.

Additional features and advantages of the techniques in the present disclosure will be made clearer by the description of the exemplary and non-limiting embodiments below, which are described with reference to the drawings.

BRIEF DESCRIPTION OF THE DRAWINGS

FIG. 6 is a diagram illustrating how a transport vehicle travels on a first route section.
FIG. 7 is a diagram illustrating how a transport vehicle travels on a second route section.
FIG. 8 is a diagram illustrating how a transport vehicle travels from a first route section through a connecting route section into a second route section.
FIG. 9 is a diagram illustrating how the speed of a transport vehicle changes upstream from a stop location.
FIG. 10 is a diagram illustrating how the speed of a transport vehicle changes in response to the transport vehicle receiving passage permission while decelerating.

DESCRIPTION OF THE INVENTION

The description below deals with an article transport facility as an embodiment with reference to drawings.

Figure 1:
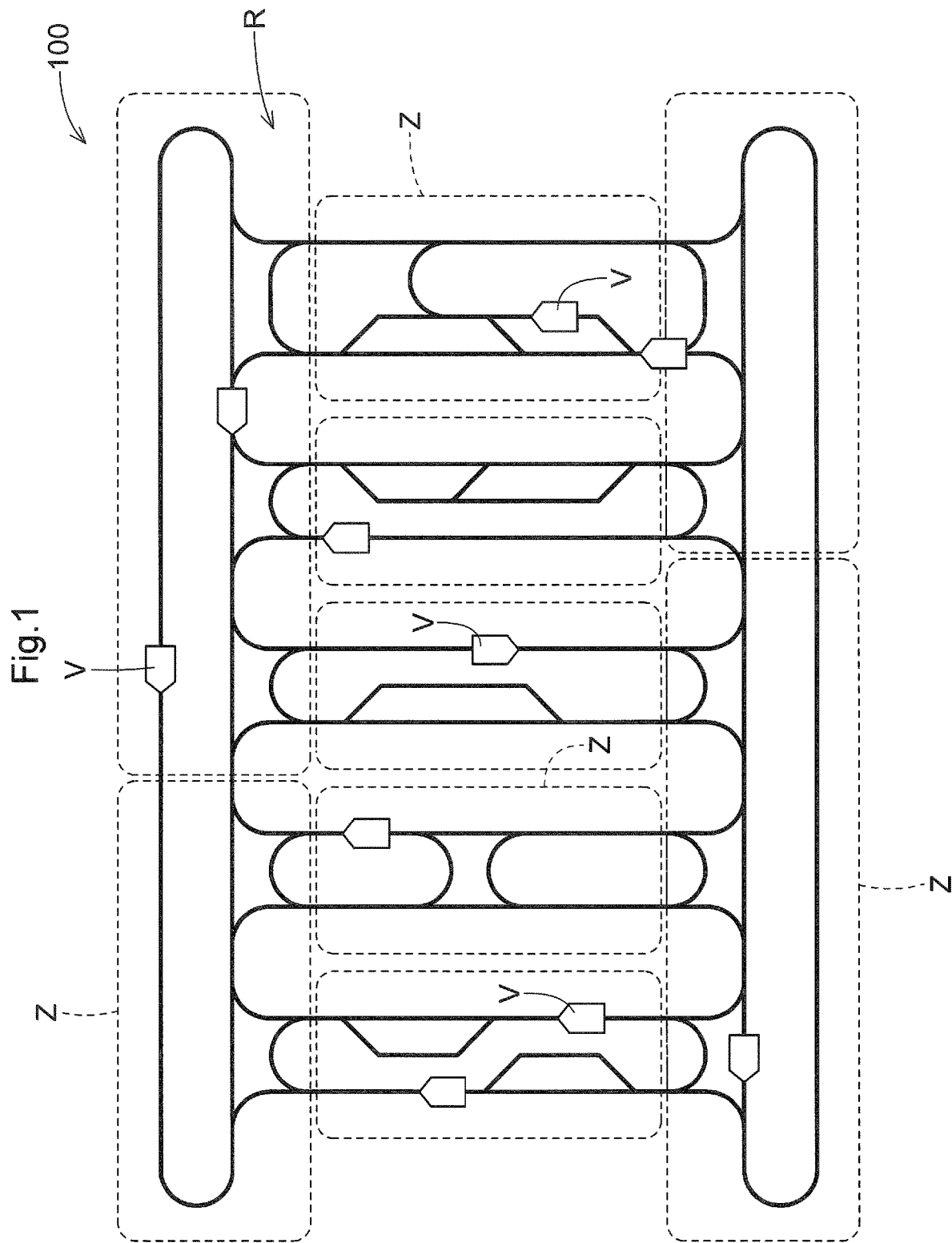
FIG. 1 is a plan view of an article transport facility.
Figure 2:
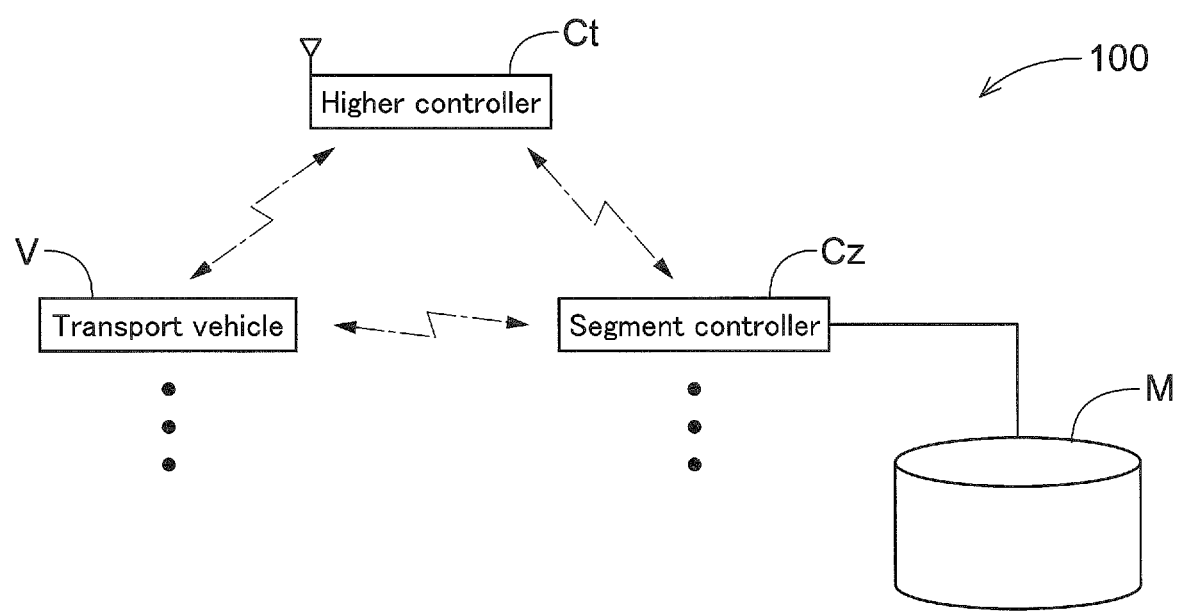
FIG. 2 is a control block diagram.

As illustrated in FIGS. 1 and 2, the article transport facility 100 includes transport vehicles V each configured to transport an article, a travel route R on which the transport vehicles V travel, and segment controllers Cz configured to give each transport vehicle V passage permission Sp (see, for example, FIG. 5) to travel in a particular segment Za and control the transport vehicle V, the particular segment Za (see FIG. 3) covering a particular portion of the travel route R.

The travel route R for the present embodiment is divided by two or more control zones Z each including one or more particular segments Za (see FIG. 3) and corresponding to a segment controller Cz. The segment controllers Cz in this example are each configured to control transport vehicles V in the control zone Z for which the segment controller Cz is responsible. More specifically, the segment controllers Cz are each configured to, when a transport vehicle V is to pass through a particular segment Za (see FIG. 3) in the control zone Z for which the segment controller Cz is responsible, determine whether to permit the transport vehicle V to pass through.

The article transport facility 100 as the present embodiment includes a higher controller Cr configured to control the segment controllers Cz. The transport vehicles V, the segment controllers Cz, and the higher controller Cr are configured to communicate with one another.

The article transport facility 100 as the present embodiment includes two or more transport vehicles V each configured to perform a task in response to a transport instruction from the higher controller Cr. Examples of the transport vehicles V include an unmanned transport vehicle configured to travel over a floor surface and a ceiling transport vehicle configured to travel near the ceiling.

The article transport facility 100 is configured to handle various articles such as a wafer container (that is, a so-called front opening unified pod [FOUP]) and a reticle container (that is, a so-called reticle pod) if the article transport facility 100 is in a semiconductor production plant. The transport vehicles V, in this case, transport such articles as they travel on the travel route R from one position to another to serve in different production steps.

The higher controller Cr is configured to control the transport vehicles V and the segment controllers Cz. The higher controller Cr, for instance, transmits to each transport vehicle V a transport instruction to transport an article from a designated starting position to a designated destination. The higher controller Cr, which is configured to communicate with the transport vehicles V, receives current position information Iv (see FIG. 4) from each transport vehicle V to recognize the current position of the transport vehicle V. The higher controller Cr is configured to recognize which portion of the travel route R each transport vehicle V will travel on. The higher controller Cr, which is configured to communicate also with the segment controllers Cz, receives from each segment controller Cz a report on the status (for example, traffic) of the corresponding control zone Z or particular segment(s) Za to recognize such a status.

Figure 3:
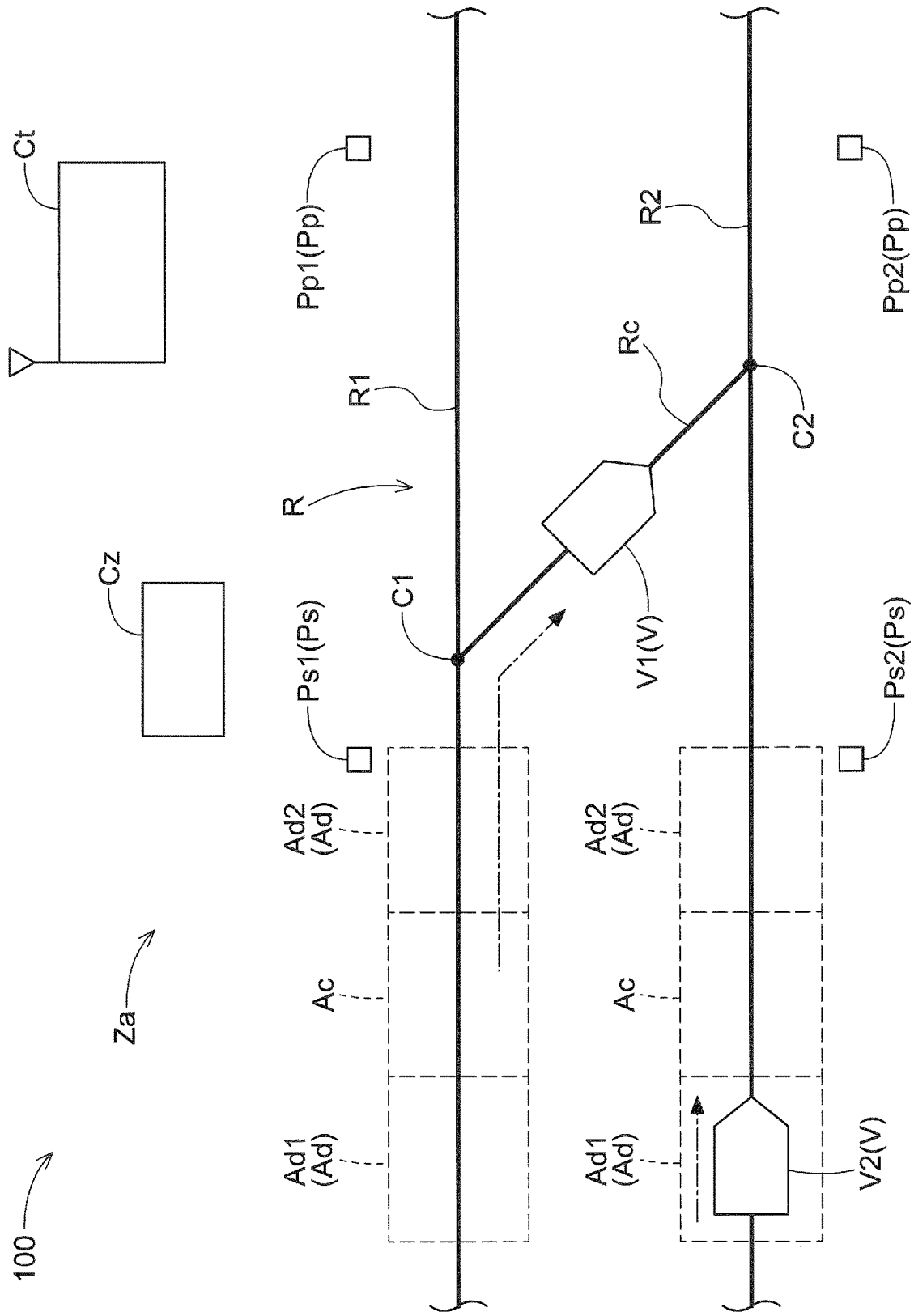
FIG. 3 is a diagram illustrating how a transport vehicle travels through a particular segment under control.

The segment controllers Cz are each configured to control transport vehicles V in the particular segment(s) Za included in the control zone Z for which the segment controller Cz is responsible. Specifically, the segment controllers Cz each cause two or more transport vehicles V to travel in the particular segment Za without coming into contact with one another. FIG. 3 illustrates, as an example, two transport vehicles V traveling in a particular segment Za. The description below refers to one of the transport vehicles V as "first transport vehicle V1" and the other transport vehicle V as "second transport vehicle V2". The segment controller Cz illustrated in FIG. 3 causes the first and second transport vehicles V1 and V2 to, when they are to pass through the same merging location in the particular segment Za, do so at different time points. FIG. 3 illustrates an example in which the segment controller Cz controls how the first and second transport vehicles V1 and V2 travel by causing the second transport vehicle V2 to, for example, decelerate or stop so that the first transport vehicle V1 will pass through the merging location earlier than the second transport vehicle V2. The segment controller Cz gives passage permission Sp (see, for example, FIG. 5) to transport vehicles V that the segment controller Cz permits to pass through the particular segment Za (described later).

The higher controller Cr and the segment controllers Cz each include a processor such as a microcomputer, a peripheral circuit such as a memory, and programs executable by the processor. The processor, the peripheral circuit, and the programs operate together to perform intended processes or functions. The article transport facility 100 includes a control system including at least the higher controller Cr and the segment controllers Cz. The control system may include an additional controller(s).

The particular segment Za illustrated in FIG. 3 covers a first route section R1, a second route section R2 that does not intersect with the first route section R1, and a connecting route section Rc connecting a first connection C1 on the first route section R1 with a second connection C2 on the second route section R2. The first and second route sections R1 and R2 are each route section on which a transport vehicles V to travel in a single direction from upstream to downstream.

The first and second route sections R1 and R2 for the present embodiment are next to each other in a plan view. The connecting route section Rc, which connects the first and second route sections R1 and R2 with each other, is inclined relative to each of the first and second route sections R1 and R2. This example is, in other words, configured such that the first and second route sections R1 and R2 and the connecting route section Rc are together shaped similar to an inverted N in a plan view.

The particular segment Za has passage locations Pp at the terminal end, that is, the downstream end. The passage locations Pp each serve as a guide to determine whether a transport vehicle V is past the particular segment Za. The passage locations Pp include a first passage location Pp1 downstream from the first connection C1 along the first route section R1 and a second passage location Pp2 downstream from the second connection C2 along the second route section R2. In other words, the present embodiment is configured such that the particular segment Za has a passage location Pp downstream from the first connection C1 along the first route section R1 and another passage location Pp downstream from the second connection C2 along the second route section R2 and that transport vehicles V that have received passage permission Sp (see, for example, FIG. 5) travel through the passage locations Pp.

The present embodiment is configured such that the particular segment Za has stop locations Ps at the starting end, that is, the upstream end. The stop locations Ps each serve as a guide for transport vehicles V to stop before the particular segment Za. The stop locations Ps include a first stop location Ps1 upstream from the first connection C1 along the first route section R1 and a second stop location Ps2 upstream from the second connection C2 along the second route section R2. In other words, the present embodiment is configured such that the particular segment Za has a stop location Ps upstream from the first connection C1 along the first route section R1 and another stop location Ps upstream from the second connection C2 along the second route section R2 and that transport vehicles V that did not receive passage permission Sp (see, for example, FIG. 5) stop at the passage locations Pp.

The present embodiment is configured such that the particular segment Za includes deceleration subsegments Ad upstream from the stop locations Ps along the first and second route sections R1 and R2. Transport vehicles V that did not receive passage permission Sp decelerate in the deceleration subsegments Ad before stopping at the stop locations Ps.

The present embodiment is configured such that the particular segment Za includes constant-speed subsegments Ac in addition to the deceleration subsegments Ad. Specifically, the particular segment Za includes constant-speed subsegments Ac upstream from the stop locations Ps along the first and second route sections R1 and R2. Transport vehicles V that did not receive passage permission Sp travel at a constant speed in the constant-speed subsegments Ac and decelerate in the deceleration subsegments Ad before stopping at the stop locations Ps. The particular segment Za includes a deceleration subsegment Ad adjacent to and upstream from each stop location Ps, and may optionally include a constant-speed subsegment Ac and another deceleration subsegment Ad upstream from the above deceleration subsegment Ad.

The deceleration subsegments Ad for the present embodiment include first deceleration subsegments Ad1 and second deceleration subsegments Ad2. FIG. 3 illustrates an example in which the particular segment Za includes a first deceleration subsegment Ad1, a constant-speed subsegment Ac, and a second deceleration subsegment Ad2 upstream from the stop location Ps along each of the first and second route sections R1 and R2. The first deceleration subsegment Ad1 is where transport vehicles V decelerate to later stop at the stop location Ps. The constant-speed subsegment Ac is adjacent to and downstream from the first deceleration subsegment Ad1, and is where transport vehicles V travel at a constant speed. The second deceleration subsegment Ad2 is adjacent to and downstream from the constant-speed subsegment Ac, and is where transport vehicles V decelerate until they stop at the stop location Ps. The stop location Ps is adjacent to and downstream from the second deceleration subsegment Ad2. The particular segment Za may further include between the second deceleration subsegment Ad2 and the stop location Ps a creep subsegment in which transport vehicles V creep (that is, travel at a very low speed).

As mentioned above, the segment controller Cz gives passage permission Sp (see, for example, FIG. 5) to transport vehicles V that the segment controller Cz permits to pass through the particular segment Za. This allows transport vehicles V that have received passage permission Sp to pass through the particular segment Za, and forces transport vehicles V that did not receive passage permission Sp to stop at the upstream side of the particular segment Za.

The transport vehicles V for the present embodiment are each configured to, after receiving passage permission Sp from the segment controller Cz and traveling past the first passage location Pp1 or second passage location Pp2, transmit a passage completion notification Sc (see, for example, FIG. 5) to the segment controller Cz. The segment controller Cz, in response to the passage completion notification Sc, becomes ready to receive a subsequent transport vehicle V into the particular segment Za.

The segment controller Cz may, after giving passage permission Sp to a transport vehicle V, not receive a subsequent response (in this example, a passage completion notification Sc) from the transport vehicle V due, for example, to a communication failure or breakdown. The segment controller Cz is, without receiving a response from the transport vehicle V, unable to determine whether the transport vehicle V is present in the particular segment Za.

Figure 4:
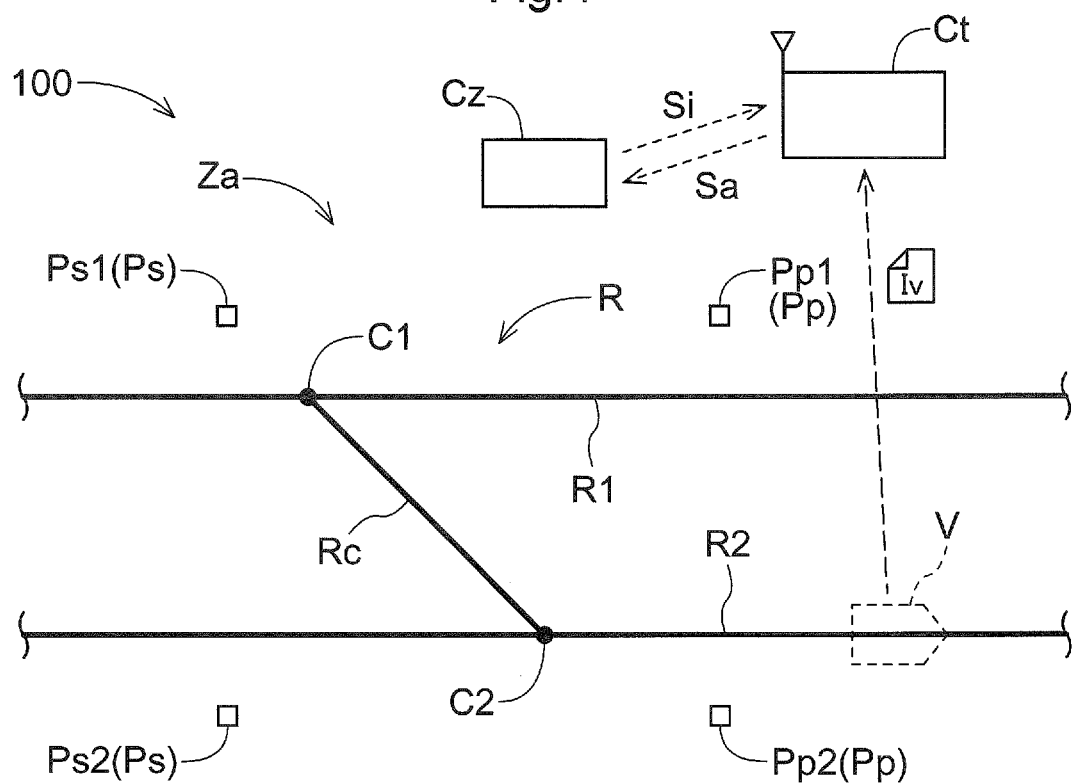
FIG. 4 is a diagram illustrating how a transport vehicle travels through a particular segment under control.

The present embodiment is thus configured as illustrated in FIG. 4 such that if the segment controller Cz, after giving passage permission Sp to a transport vehicle V, does not receive a response (that is, a passage completion notification Sc) from the transport vehicle V, the segment controller Cz transmits an inquiry Si to the higher controller Cr. In this example, if the segment controller Cz, after giving passage permission Sp to a transport vehicle V, does not receive a response (that is, a passage completion notification Sc) from the transport vehicle V within a predetermined time period, the segment controller Cz transmits an inquiry Si to the higher controller Cr. The predetermined time period depends on such factors as the distance over which each transport vehicle V travels in the particular segment Za and the speed at which each transport vehicle V travels.

The higher controller Cr for the present embodiment is configured to, in response to an inquiry Si from the segment controller Cz, determine on the basis of whether the transport vehicle V is present in the particular segment Za whether the transport vehicle V has traveled past the first passage location Pp1 or second passage location Pp2. In this example, the higher controller Cr, in response to an inquiry Si, determines on the basis of current position information Iv received from the transport vehicle V and indicative of the current position of the transport vehicle V whether the transport vehicle V is present in the particular segment Za, and returns a reply Sa about the determination result to the segment controller Cz. The segment controller Cz, in response to the reply Sa, continues controlling the transport vehicle V in the particular segment Za on the basis of whether the transport vehicle V is present in the particular segment Za as indicated by the reply Sa. This configuration allows the segment controller Cz to, if it does not receive a response from a transport vehicle V, control the transport vehicle V in the particular segment Za appropriately through cooperation with the higher controller Cr. The higher controller Cr, in this example, determines whether a transport vehicle V has traveled past the first passage location Pp1 or second passage location Pp2 as described above only in response to an inquiry Si from the segment controller Cz. Cooperating with the higher controller Cr only when necessary as such prevents a heavy processing load on the higher controller Cr while allowing the segment controller Cz to control transport vehicles V in the particular segment Za appropriately.

The description below deals in greater detail with how the segment controllers Cz each control transport vehicles V in a particular segment Za.

Figure 5:
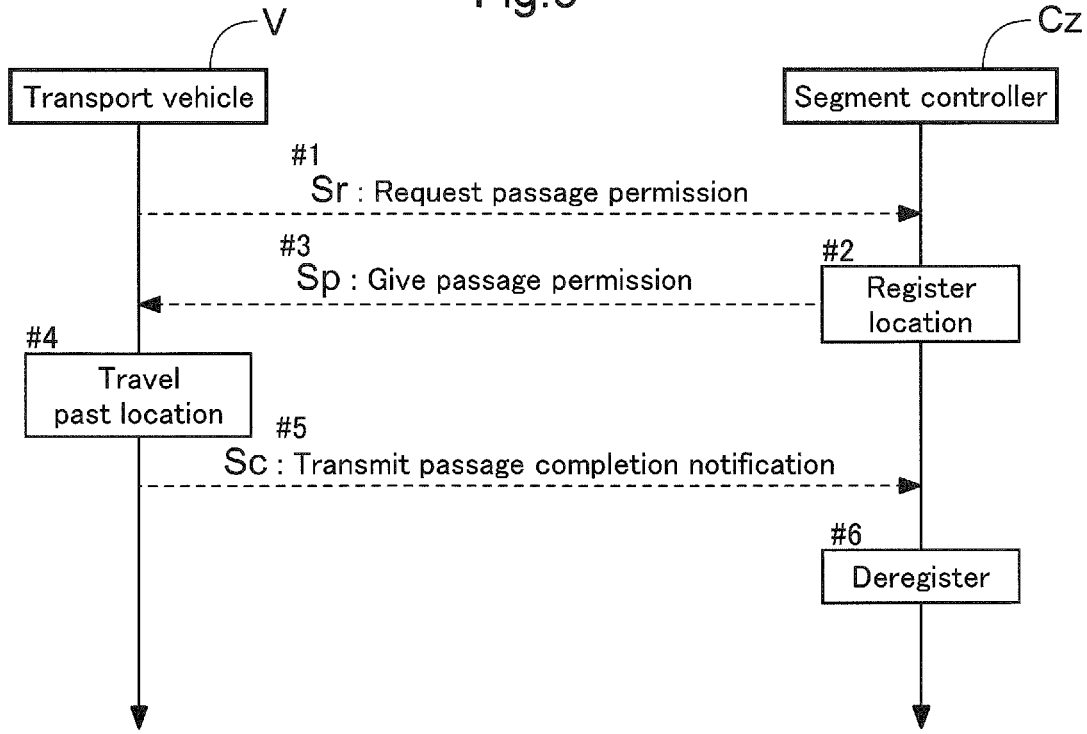
FIG. 5 is a flowchart.

As illustrated in FIG. 5, each transport vehicle V that is to pass through a particular segment Za, specifically, to travel past a passage location Pp, transmits a passage permission request Sr to the segment controller Cz corresponding to the particular segment Za to request permission for the passage (step #1). The present embodiment is configured such that the transport vehicle V transmits the passage permission request Sr to the segment controller Cz at a position upstream from the particular segment Za (specifically, from the first connection C1 or second connection C2).

If the segment controller Cz has determined that it is able to cause the transport vehicle V (which has transmitted the passage permission request Sr to the segment controller Cz) to pass through the particular segment Za, the segment controller Cz registers the passage location Pp associated with the passage permission request Sr for occupation by the transport vehicle V (which has transmitted the passage permission request Sr to the segment controller Cz) (step #2), and simultaneously transmits passage permission Sp to the transport vehicle V (step #3). The segment controller Cz determines whether the passage location Pp associated with the passage permission request Sr is occupied or unoccupied by a preceding transport vehicle V. The segment controller Cz, if the passage location Pp is unoccupied, determines that it is able to cause the transport vehicle V (which has transmitted the passage permission request Sr to the segment controller Cz) to travel past the passage location Pp. The segment controller Cz, in this example, includes a storage M configured to store occupation information, that is, information on whether each passage location Pp is occupied or unoccupied (see FIG. 2). The segment controller Cz gives passage permission Sp to transport vehicles V on the basis of the occupation information stored in the storage M. The segment controller Cz is configured to update the occupation information as necessary to reflect the current status of the particular segment Za.

The transport vehicle V, after receiving the passage permission Sp, passes through the particular segment Za, specifically, travels past the passage location Pp (step #4), and after finishing the passage, transmits a passage completion notification Sc to the segment controller Cz (step #5).

The segment controller Cz, in response to the passage completion notification Sc, deregisters the passage location Pp that the segment controller Cz has permitted the transport vehicle V (which has transmitted the passage completion notification Sc to the segment controller Cz) to occupy (step #6). This renders the passage location Pp (which the segment controller Cz has deregistered) unoccupied, and thus renders the segment controller Cz ready to receive a subsequent transport vehicle V at the passage location Pp. The terms such as "occupy" and "occupation" used to describe the present invention may also refer to "reserve" or "reservation".

The passage permission request Sr, the passage permission Sp, and the passage completion notification Sc are each in the form of a signal that either the segment controllers Cz or the transport vehicles V transmit to the other; for example, the passage permission request Sr is a passage permission request signal, the passage permission Sp is a passage permission signal, and the passage completion notification Sc is a passage completion signal. The passage request signal may be in any form that allows the segment controllers Cz to recognize that a transport vehicle V is to travel past a passage location Pp. Examples of the passage request signal include a signal for requesting permission to travel past a passage location Pp and a signal for requesting permission to occupy a passage location Pp, among various others.

FIGS. 6 to 8 each illustrate an example of how a transport vehicle V passes through a particular segment Za under control of the corresponding segment controller Cz. FIG. 6 illustrates example 1, in which a transport vehicle V travels past the first connection C1 on the first route section R1. FIG. 7 illustrates example 2, in which a transport vehicle V travels past the second connection C2 on the second route section R2. FIG. 8 illustrates example 3, in which a transport vehicle V travels from the first route section R1 through the connecting route section Rc into the second route section R2.

Example 1

As illustrated in FIG. 6, when a transport vehicle V is to travel past the first connection C1 on the first route section R1, the transport vehicle V requests first passage permission Sp1, which is passage permission Sp to travel past the first passage location Pp1, from the corresponding segment controller Cz at a position upstream from the first connection C1. The transport vehicle V, in this example, requests first passage permission Sp1 from the segment controller Cz while traveling upstream from the first stop location Ps1 on the first route section R1. The transport vehicle V, if it receives first passage permission Sp1, travels past the first connection C1 toward the first passage location Pp1, and if not, stops upstream from the first connection C1.

As illustrated in (a) of FIG. 6, the present embodiment is configured such that the transport vehicle V, if it is to travel past the first passage location Pp1, transmits a first passage permission request Sr1 to the segment controller Cz. In response to the first passage permission request Sr1, the segment controller Cz determines whether the first passage location Pp1 is occupied by a preceding transport vehicle V, and if it is not occupied, determines that it is able to cause the transport vehicle V (which has transmitted the first passage permission request Sr1 to the segment controller Cz) to travel past the first passage location Pp1. The segment controller Cz, in other words, determines whether the first passage location Pp1 is occupied or unoccupied, and if it is unoccupied, determines that it is able to cause the transport vehicle V to travel past the first passage location Pp1. The segment controller Cz then gives first passage permission Sp1 to the transport vehicle V (which has transmitted the first passage permission request Sr1 to the segment controller Cz).

The present embodiment is configured such that the segment controller Cz, if it has given first passage permission Sp1 to a transport vehicle V, allows the transport vehicle V to occupy the first passage location Pp1 associated with the first passage permission Sp1. The first passage location Pp1 is thereby occupied by the transport vehicle V. The segment controller Cz, in this example, registers the first passage location Pp1 associated with the first passage permission Sp1 for occupation by the transport vehicle V. The segment controller Cz thereby excludes other transport vehicles V from the first passage location Pp1 and prohibits them from traveling past the first passage location Pp1.

As illustrated in (b) of FIG. 6, the present embodiment is configured such that the transport vehicle V, after traveling past the first passage location Pp1, transmits a passage completion notification Sc to the segment controller Cz. After receiving the passage completion notification Sc, the segment controller Cz ends the occupation by the transport vehicle V of the first passage location Pp1 associated with the passage completion notification Sc. This renders the first passage location Pp1 unoccupied. In this example, the segment controller Cz, in response to the passage completion notification Sc, deregisters the first passage location Pp1 that the segment controller Cz has permitted the transport vehicle V (which has transmitted the passage completion notification Sc to the segment controller Cz) to occupy. This ends the occupation of the first passage location Pp1 by the transport vehicle V, and renders the first passage location Pp1 ready to receive another transport vehicle V.

Example 2

As illustrated in FIG. 7, when a transport vehicle V is to travel past the second connection C2 on the second route section R2, the transport vehicle V requests second passage permission Sp2, which is passage permission Sp to travel past the second passage location Pp2, from the corresponding segment controller Cz at a position upstream from the second connection C2. The transport vehicle V, in this example, requests second passage permission Sp2 from the segment controller Cz while traveling upstream from the second stop location Ps2 on the second route section R2. The transport vehicle V, if it receives second passage permission Sp2, travels past the second connection C2 toward the second passage location Pp2, and if not, stops upstream from the second connection C2.

As illustrated in (a) of FIG. 7, the present embodiment is configured such that the transport vehicle V, if it is to travel past the second passage location Pp2, transmits a second passage permission request Sr2 to the segment controller Cz. In response to the second passage permission request Sr2, the segment controller Cz determines whether the second passage location Pp2 is occupied by a preceding transport vehicle V, and if it is not occupied, determines that it is able to cause the transport vehicle V (which has transmitted the second passage permission request Sr2 to the segment controller Cz) to travel past the second passage location Pp2. The segment controller Cz, in other words, determines whether the second passage location Pp2 is occupied or unoccupied, and if it is unoccupied, determines that it is able to cause the transport vehicle V to travel past the second passage location Pp2. The segment controller Cz then gives second passage permission Sp2 to the transport vehicle V (which has transmitted the second passage permission request Sr2 to the segment controller Cz).

The present embodiment is configured such that the segment controller Cz, if it has given second passage permission Sp2 to a transport vehicle V, allows the transport vehicle V to occupy the second passage location Pp2 associated with the second passage permission Sp2. The second passage location Pp2 is thereby occupied by the transport vehicle V. The segment controller Cz, in this example, registers the second passage location Pp2 associated with the second passage permission Sp2 for occupation by the transport vehicle V. The segment controller Cz thereby excludes other transport vehicles V from the second passage location Pp2 and prohibits them from traveling past the second passage location Pp2.

As illustrated in (b) of FIG. 7, the present embodiment is configured such that the transport vehicle V, after traveling past the second passage location Pp2, transmits a passage completion notification Sc to the segment controller Cz. After receiving the passage completion notification Sc, the segment controller Cz ends the occupation by the transport vehicle V of the second passage location Pp2 associated with the passage completion notification Sc. This renders the second passage location Pp2 unoccupied. In this example, the segment controller Cz, in response to the passage completion notification Sc, deregisters the second passage location Pp2 that the segment controller Cz has permitted the transport vehicle V (which has transmitted the passage completion notification Sc to the segment controller Cz) to occupy. This ends the occupation of the second passage location Pp2 by the transport vehicle V, and renders the second passage location Pp2 ready to receive another transport vehicle V.

Example 3

As illustrated in FIG. 8, when a transport vehicle V is to travel from the first route section R1 or second route section R2 into the connecting route section Rc, the transport vehicle V requests both first passage permission Sp1 and second passage permission Sp2 from the corresponding segment controller Cz at a position upstream from the first connection C1 or second connection C2. In response to the request from the transport vehicle V to travel from the first route section R1 or second route section R2 into the connecting route section Rc, the segment controller Cz, if the first and second passage locations Pp1 and Pp2 are both unoccupied by preceding transport vehicles V, permits the transport vehicle V to travel from the first route section R1 or second route section R2 into the connecting route section Rc and to occupy both the first and second passage locations Pp1 and Pp2.

FIG. 8 illustrates an example in which a transport vehicle V is to travel from the first route section R1 through the connecting route section Rc and past the second passage location Pp2 on the second route section R2. FIG. 8 illustrates the transport vehicle V as transmitting a first passage permission request Sr1 for first passage permission Sp1 and a second passage permission request Sr2 for second passage permission Sp2 to the segment controller Cz at a position upstream from the first connection C1. The segment controller Cz, if both the first and second passage locations Pp1 and Pp2 are unoccupied, gives first passage permission Sp1 and second passage permission Sp2 to the transport vehicle V (which has transmitted the first and second passage permission requests Sr1 and Sr2 to the segment controller Cz). The segment controller Cz, if at least either of the first and second passage locations Pp1 and Pp2 is occupied by a preceding transport vehicle V, refuses the request from the transport vehicle V (which has requested passage permission Sp) to travel as above (that is, does not permit the transport vehicle V to travel as above). In this case, the transport vehicle V (whose request to travel as above has been refused) stops upstream from the connecting route section Rc. The transport vehicle V, in this example, stops upstream from the first connection C1.

As illustrated in (a) of FIG. 8 as an example, a transport vehicle V transmits first and second passage permission requests Sr1 and Sr2 to the segment controller Cz if the transport vehicle V is to travel from the first route section R1 through the connecting route section Rc and past the second passage location Pp2. In response to the first and second passage permission requests Sr1 and Sr2, the segment controller Cz determines whether the first and second passage locations Pp1 and Pp2 are occupied by a preceding transport vehicle V, and if they are not occupied, determines that it is able to cause the transport vehicle V to travel past the second passage location Pp2. The segment controller Cz, in other words, determines whether the first and second passage locations Pp1 and Pp2 are occupied or unoccupied, and if they are both unoccupied, determines that it is able to cause the transport vehicle V to travel past the second passage location Pp2. The segment controller Cz then gives first passage permission Sp1 and second passage permission Sp2 to the transport vehicle V (which has transmitted the first and second passage permission requests Sr1 and Sr2 to the segment controller Cz). A transport vehicle V similarly transmits first and second passage permission requests Sr1 and Sr2 to the segment controller Cz if the transport vehicle V is to travel from the second route section R2 through the connecting route section Rc and past the first passage location Pp1. The segment controller Cz then determines whether the first and second passage locations Pp1 and Pp2 are occupied or unoccupied, and if they are both unoccupied, gives first passage permission Sp1 and second passage permission Sp2 to the transport vehicle V (which has transmitted the first and second passage permission requests Sr1 and Sr2 to the segment controller Cz).

As illustrated in (b) of FIG. 8, the transport vehicle V, after traveling from the first route section R1 through the connecting route section Rc and past the second passage location Pp2 on the second route section R2, transmits a passage completion notification Sc to the segment controller Cz. The present embodiment is configured such that after receiving the passage completion notification Sc, the segment controller Cz ends the occupation by the transport vehicle V of the first and second passage locations Pp1 and Pp2. This renders the first and second passage locations Pp1 and Pp2 unoccupied. In this example, the segment controller Cz, in response to the passage completion notification Sc, deregisters the first and second passage locations Pp1 and Pp2 that the segment controller Cz has permitted the transport vehicle V (which has transmitted the passage completion notification Sc to the segment controller Cz) to occupy. This ends the occupation of the first and second passage locations Pp1 and Pp2 by the transport vehicle V, and renders each of the first and second passage locations Pp1 and Pp2 ready to receive another transport vehicle V. A transport vehicle V similarly transmits a passage completion notification Sc to the segment controller Cz after traveling from the second route section R2 through the connecting route section Rc and past the first passage location Pp1 on the first route section R1. After receiving the passage completion notification Sc, the segment controller Cz ends the occupation by the transport vehicle V of the first and second passage locations Pp1 and Pp2.

As described above, a transport vehicle V that is to travel past a merging (branching) location along the first route section R1 requests from the segment controller Cz only first passage permission Sp1, that is, permission to travel past the first passage location Pp1, whereas a transport vehicle V that is to travel past a merging (branching) location along the second route section R2 requests from the segment controller Cz only second passage permission Sp2, that is, permission to travel past the second passage location Pp2. The segment controller Cz, if the passage location Pp (through which the transport vehicle V has requested permission to pass) is unoccupied, permits the transport vehicle V (which has requested the permission) to occupy the passage location Pp. This configuration allows two or more transport vehicles V to travel concurrently on the first and second route sections R1 and R2 if the transport vehicles V are to travel not through the connecting route section Rc. This in turn allows transport vehicles V to travel through a particular segment Za efficiently as compared to a case of a segment controller determining whether to permit a transport vehicle to pass through all passage locations in a particular segment.

A transport vehicle V requests both first passage permission Sp1 and second passage permission Sp2 from the segment controller Cz if the transport vehicle V is to travel from the first route section R1 to the second route section R2 or otherwise through the connecting route section Rc, as the transport vehicle V will travel past either the first passage location Pp1 or the second passage location Pp2. In this case, the segment controller Cz, if the first and second passage locations Pp1 and Pp2 are both unoccupied, permits the transport vehicle V (which has requested the permission) to travel as intended and occupy both the first and second passage locations Pp1 and Pp2. This configuration facilitates preventing two or more transport vehicles V from coming into contact with one another in a particular segment Za.

The description below deals with the above configuration in greater detail. The present embodiment is configured such that the segment controller Cz is, after giving passage permission Sp to a transport vehicle V, unable to determine the position of the transport vehicle V until the segment controller Cz receives a passage completion notification Sc from the transport vehicle V. The segment controller Cz is thus unable to determine where a transport vehicle V has stopped if, for instance, the transport vehicle V is to travel from the first route section R1 through the connecting route section Rc into the second route section R2, and after receiving passage permission Sp from the segment controller Cz, has stopped partway for a reason. If the transport vehicle V has stopped at the first connection C1 or somewhere upstream from the first connection C1 on the first route section R1, a subsequent transport vehicle V traveling on the first route section R1 will come into contact with the transport vehicle V at rest. If the transport vehicle V has stopped somewhere close to the first connection C1 on the connecting route section Rc, a subsequent transport vehicle V may also come into contact with the transport vehicle V at rest. This necessitates occupying both the first and second passage locations Pp1 and Pp2 if a transport vehicle V is to use both the first and second route sections R1 and R2 through the connecting route section Re even though the transport vehicle V will travel past only either of the first and second passage locations Pp1 and Pp2. The above configuration allows both the first and second passage locations Pp1 and Pp2 to be occupied by a transport vehicle V, and thereby forces a subsequent transport vehicle V to stop at a stop location Ps if the above transport vehicle V has stopped partway. This in turn prevents two or more transport vehicles V from coming into contact with one another.

As described above, the present embodiment is configured such that the particular segment Za includes deceleration subsegments Ad upstream from the stop locations Ps along the first and second route sections R1 and R2. Transport vehicles V decelerate in the deceleration subsegments Ad before stopping at the stop locations Ps. The deceleration subsegments Ad, in this example, include first deceleration subsegments Ad1 on the upstream side and second deceleration subsegments Ad2 on the downstream side. The particular segment Za also includes constant-speed subsegments Ac between the first deceleration subsegments Ad1 and the second deceleration subsegments Ad2 on the travel route R.

As illustrated in FIG. 9, the present embodiment is configured such that the transport vehicles V decelerate at a constant rate through each deceleration subsegment Ad. In this example, the transport vehicles V decelerate at a constant rate through each of the first and second deceleration subsegments Ad1 and Ad2. This configuration facilitates simplifying how the transport vehicles V decelerate. The transport vehicles V may decelerate as such not only when traveling through a deceleration subsegment Ad but also, for instance, before stopping at a destination to transfer an article or when traveling on a curve.

The present embodiment is configured such that the transport vehicles V each transmit a passage permission request Sr to a segment controller Cz at a position upstream from a deceleration subsegment Ad or in a deceleration subsegment Ad. If the transport vehicle V has received passage permission Sp from the segment controller Cz at a position upstream from the deceleration subsegment Ad, the transport vehicle V does not decelerate and continues traveling at the current speed. If the transport vehicle V did not receive passage permission Sp from the segment controller Cz before entering the deceleration subsegment Ad, the transport vehicle V starts to decelerate. If the transport vehicle V did not receive passage permission Sp from the segment controller Cz before reaching a stop location Ps, the transport vehicle V stops at the stop location Ps. As described above, the present embodiment includes a constant-speed subsegment Ac, where the transport vehicles V each travel at a constant speed, other than the deceleration subsegment Ad. This ensures a relatively long time period for the transport vehicle V to come to a full stop. If the transport vehicle V receives passage permission Sp before coming to a full stop, the transport vehicle V is able to avoid stopping and continue traveling.

A transport vehicle V may not receive passage permission Sp from the segment controller Cz due to another transport vehicle V, for instance, because a preceding transport vehicle V is in the particular segment Za. In such a case, the transport vehicle V, to later stop at the stop location Ps, decelerates through the first deceleration subsegment Ad1, travels at a constant speed through the constant-speed subsegment Ac, and decelerates again through the second deceleration subsegment Ad2 while waiting for passage permission Sp from the segment controller Cz.

As illustrated in FIG. 10, the transport vehicle V, in response to receiving passage permission Sp while decelerating through a deceleration subsegment Ad, starts to travel at a constant speed and then accelerates. FIG. 10 illustrates an example in which a transport vehicle V, in response to receiving passage permission Sp while traveling through a first deceleration subsegment Ad1, starts to travel at a constant speed in the first deceleration subsegment Ad1 and then accelerates until the transport vehicle V travels at the speed at which the transport vehicle V traveled before entering the first deceleration subsegment Ad1. The transport vehicle V, in response to receiving passage permission Sp while decelerating, does not start to accelerate immediately but starts to travel at a constant speed before accelerating as above. This configuration not only reduces a load on a travel driving source in the transport vehicle V such as a motor, but also reduces vibration of an article that the transport vehicle V is transporting. The transport vehicle V, in response to receiving passage permission Sp while traveling through a second deceleration subsegment Ad2, similarly starts to travel at a constant speed before accelerating (not illustrated in the drawings).

Figure 11:
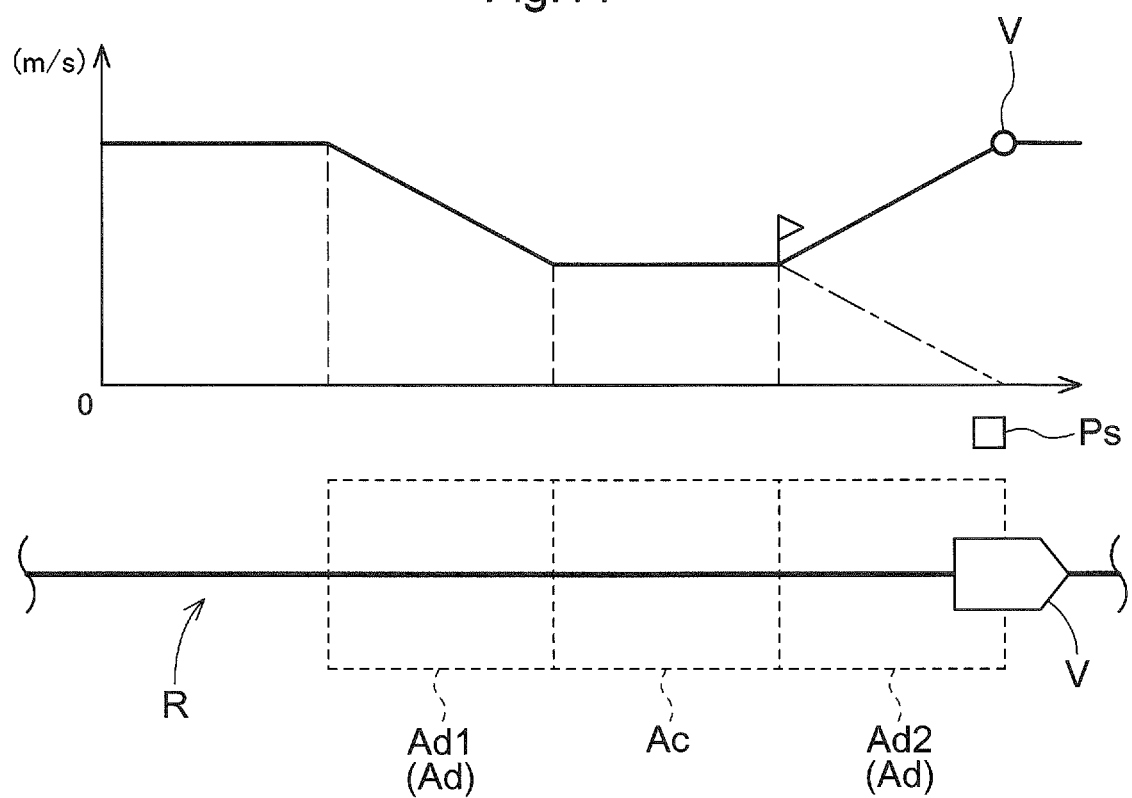
FIG. 11 is a diagram illustrating how the speed of a transport vehicle changes in response to the transport vehicle receiving passage permission while traveling at a constant speed.

As illustrated in FIG. 11, the transport vehicle V, in response to receiving passage permission Sp while traveling at a constant speed through a constant-speed subsegment Ac, starts to accelerate immediately. FIG. 11 illustrates an example in which a transport vehicle V, in response to receiving passage permission Sp while traveling at a constant speed through a constant-speed subsegment Ac after decelerating through a first deceleration subsegment Ad1, starts to accelerate immediately until the transport vehicle V travels at the speed at which the transport vehicle V traveled before entering the first deceleration subsegment Ad1. The transport vehicle V, in response to receiving passage permission Sp while not decelerating but traveling at a constant speed, starts to accelerate immediately as above to shorten the time period necessary to reach the destination. Starting to accelerate while traveling at a constant speed imposes a lighter load on a travel driving source in the transport vehicle V such as a motor than starting to accelerate while decelerating.

Alternative Embodiments

The description below deals with article transport facilities as alternative embodiments.

Figure 12:
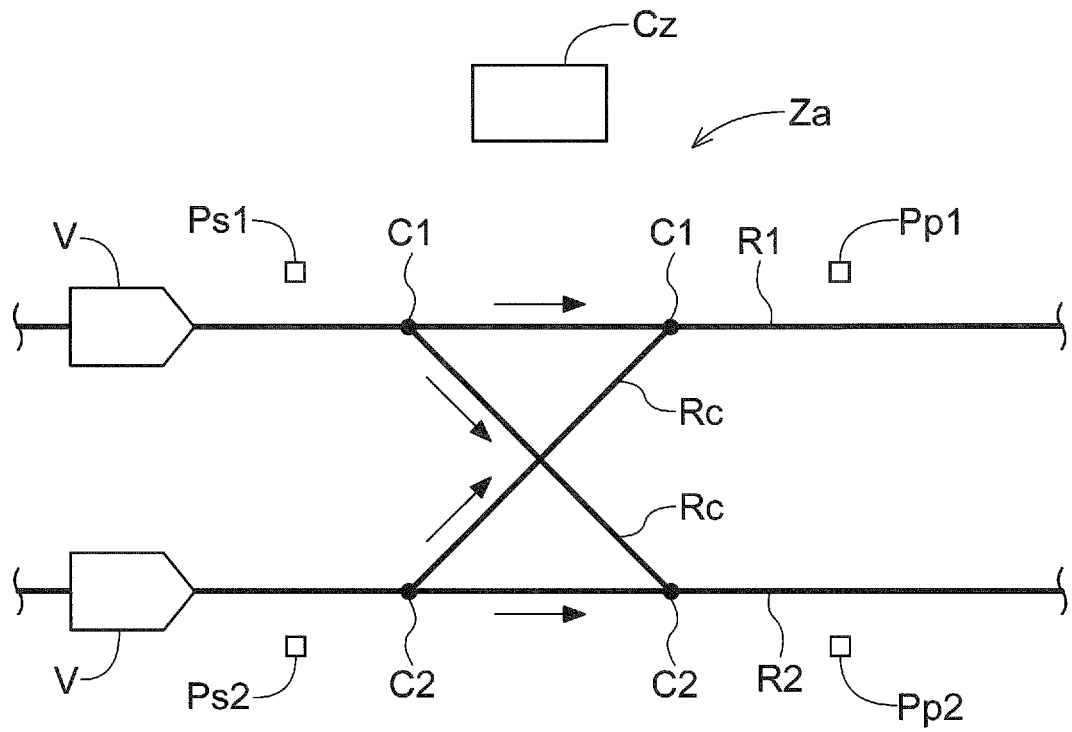
FIG. 12 is a plan view of a particular segment for an alternative embodiment.
Figure 13:
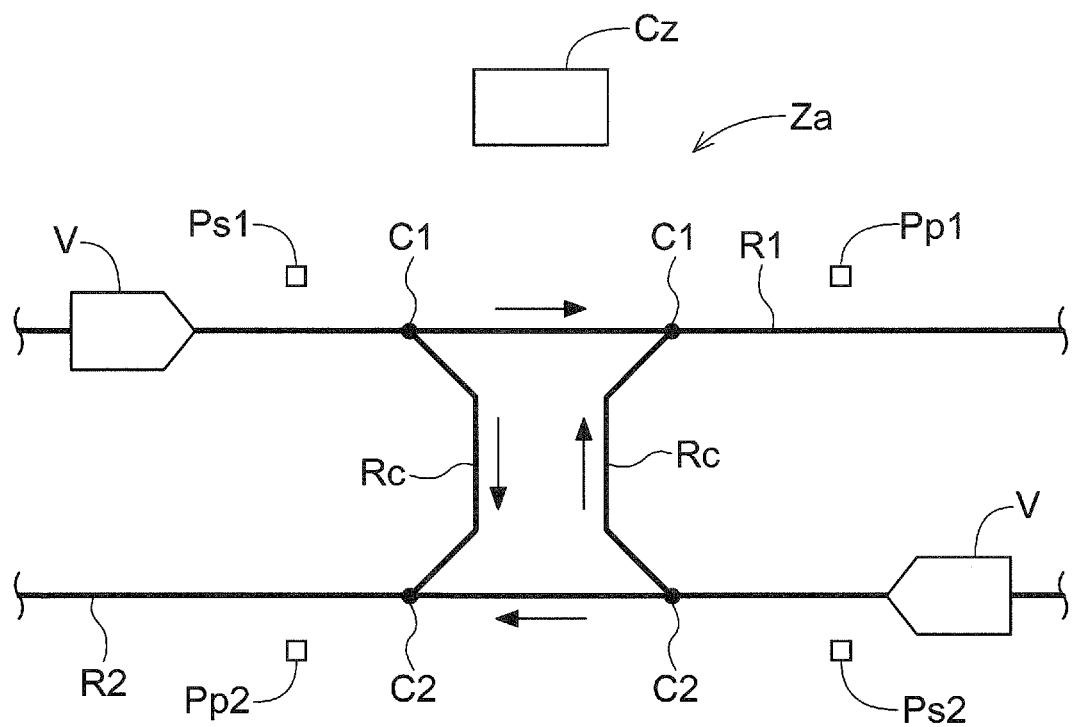
FIG. 13 is a plan view of a particular segment for an alternative embodiment.
Figure 14:
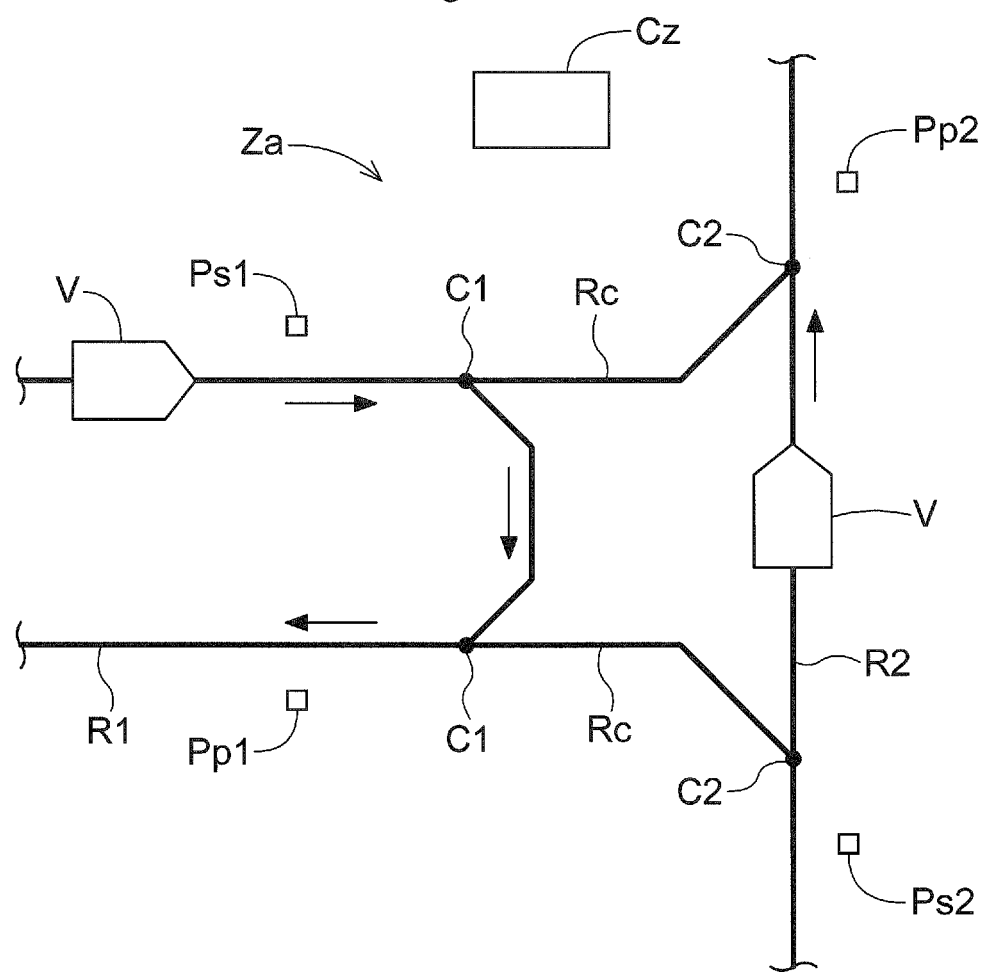
FIG. 14 is a plan view of a particular segment for an alternative embodiment.

(1) The embodiment described above under "Description of Embodiments" is an example in which the first and second route sections R1 and R2 and the connecting route section Rc are together shaped similar to an inverted N in a plan view. The present invention is, however, not limited to this example; the first and second route sections R1 and R2 and the connecting route section Re may be together in the shape of an H in a plan view. In other words, the connecting route section Re may be orthogonal in a plan view to the first and second route sections R1 and R2 next to each other. The article transport facility may have a particular segment Za at any portion of the travel route R. The connecting route section Re may connect with the first and second route sections R1 and R2 in any manner. For instance, as illustrated in FIGS. 12 to 14, the particular segment Za may include two or more connecting route sections Re each connecting with the first and second route sections R1 and R2. The connecting route sections Re may each connect with the first and second route sections R1 and R2 at any angle. At least one of the first and second route sections R1 and R2 and the connecting route sections Re may have a bend. As illustrated in FIG. 14, the article transport facility may have such a particular segment Za at, for example, a portion of the travel route R which portion includes two or more bays (that is, route sections each for a particular process step) and a route section connecting those bays.

(2) The embodiment described above under "Description of Embodiments" is an example including not only deceleration subsegments Ad but also a constant-speed subsegment Ac upstream from a stop location Ps on the travel route R. The present invention is, however, not limited to this example; the constant-speed subsegment Ac may be absent. In such a case, the deceleration subsegments Ad may be next to each other at a position adjacent to and upstream from the stop location Ps.

(3) The embodiment described above under "Description of Embodiments" is an example in which a segment controller Cz registers the passage location Pp associated with a passage permission request Sr for occupation by the transport vehicle V that has transmitted the passage permission request Sr to the segment controller Cz, and simultaneously transmits passage permission Sp to the transport vehicle V. The present invention is, however, not limited to this example; the segment controller Cz may register the passage location Pp and transmit passage permission Sp to the transport vehicle V at different time points. In such a case, the controller Cz may register the passage location Pp before or after transmitting passage permission Sp to the transport vehicle V.

(4) The embodiment described above under "Description of Embodiments" is an example in which the passage permission request Sr, the passage permission Sp, and the passage completion notification Sc are each in the form of a signal that either the segment controllers Cz or the transport vehicles V transmit directly to the other. The present invention is, however, not limited to this example; the above signals may be transmitted between the segment controller Cz and the transport vehicles V via the higher controller Cr.

(5) The embodiment described above under "Description of Embodiments" is an example in which (i) when a transport vehicle V is to travel past the first connection C1 on the first route section R1, the transport vehicle V requests first passage permission Sp1 from the segment controller Cz, (ii) when a transport vehicle V is to travel past the second connection C2 on the second route section R2, the transport vehicle V requests second passage permission Sp2 from the segment controller Cz, and (iii) when a transport vehicle V is to travel through the connecting route section Rc, the transport vehicle V requests both first passage permission Sp1 and second passage permission Sp2 from the segment controller Cz. The present invention is, however, not limited to this example, and may not discriminate first passage permission Sp1 and second passage permission Sp2 from each other. In such a case, a transport vehicle V simply requests passage permission Sp from the segment controller Cz regardless of which path the transport vehicle V will take. The segment controller Cz may receive from the higher controller Cr, which stores information on which path the transport vehicle V will take, information on the path, and on the basis of that information, permit the transport vehicle V to occupy either or both of the first and second passage locations Pp1 and Pp2. Specifically, if the transport vehicle V (which has requested the passage permission Sp) is to travel past the first passage location Pp1, the segment controller Cz receives information on the intended travel from the higher controller Cr, and thereby permits the transport vehicle V to occupy the first passage location Pp1. If the transport vehicle V (which has requested the passage permission Sp) is to travel past the second passage location Pp2, the segment controller Cz receives information on the intended travel from the higher controller Cr, and thereby permits the transport vehicle V to occupy the second passage location Pp2. If the transport vehicle V (which has requested the passage permission Sp) is to travel through the connecting route section Rc, the segment controller Cz receives information on the intended travel from the higher controller Cr, and thereby permits the transport vehicle V to occupy the first and second passage locations Pp1 and Pp2.

(6) The arrangements disclosed for any of the embodiments described above are combinable with the arrangements disclosed for any other embodiment unless such a combination causes any inconvenience. The embodiments described herein are mere examples in any respect. The present invention may thus be modified variously as appropriate without departing from the scope of the present disclosure.

Outline of Embodiment

The description below outlines the article transport facility described above under "Description of Embodiments".

An article transport facility according to the present invention includes:
  a transport vehicle configured to transport an article;
  a travel route on which the transport vehicle travels; and
  at least one segment controller configured to give passage permission to the transport vehicle traveling in a particular segment and control the transport vehicle, the particular segment covering a particular portion of the travel route,
wherein the particular segment covers:
  a first route section;
  a second route section that does not intersect with the first route section; and
  a connecting route section connecting a first connection on the first route section with a second connection on the second route section,
the first route section and the second route section are each a route section on which the transport vehicle travels in a single direction from upstream to downstream,
the first route section has a first passage location downstream from the first connection,
the second route section has a second passage location downstream from the second connection,
in a case where the transport vehicle travels past the first connection on the first route section,
  the transport vehicle requests first passage permission from the at least one segment controller at a position upstream from the first connection, the first passage permission being the passage permission to travel past the first passage location,
  in response to receiving the first passage permission, the transport vehicle travels past the first connection toward the first passage location, and
  in response to failing to receive the first passage permission, the transport vehicle stops upstream from the first connection,
in a case where the transport vehicle travels past the second connection on the second route section,
  the transport vehicle requests second passage permission from the at least one segment controller at a position upstream from the second connection, the second passage permission being the passage permission to travel past the second passage location,
  in response to receiving the second passage permission, the transport vehicle travels past the second connection toward the second passage location, and
  in response to failing to receive the second passage permission, the transport vehicle stops upstream from the second connection,
in a case where the at least one segment controller has given the first passage permission to the transport vehicle, the at least one segment controller permits the transport vehicle to occupy the first passage location associated with the first passage permission,
in a case where the at least one segment controller has given the second passage permission to the transport vehicle, the at least one segment controller permits the transport vehicle to occupy the second passage location associated with the second passage permission,
in a case where the transport vehicle travels from the first route section or second route section into the connecting route section, the transport vehicle requests both the first passage permission and the second passage permission from the at least one segment controller,
in response to the request for both the first passage permission and the second passage permission, the at least one segment controller, if the first passage location and the second passage location are both unoccupied by preceding transport vehicles, permits the transport vehicle to travel from the first route section or second route section into the connecting route section and to occupy both the first passage location and the second passage location.

The particular segment covers a first route section and a second route section that does not intersect with the first route section. The particular segment thus allows different transport vehicles to travel concurrently on the first and second route sections if no transport vehicle travels through the connecting route section. The above configuration makes it possible to determine whether to permit a transport vehicle to travel past the first passage location on the first route section or the second passage location on the second route section individually. This allows two or more transport vehicles to travel concurrently on the first and second route sections if those transport vehicles are to travel not through the connecting route section. This in turn allows transport vehicles to travel through a particular segment efficiently as compared to a case of a segment controller determining whether to permit a transport vehicle to pass through all passage locations in a particular segment. In a case where a transport vehicle travels from the first route section through the connecting route section into the second route section or from the second route section through the connecting route section into the first route section, the segment controller, if the first and second passage locations are both unoccupied by other preceding transport vehicles, permits the transport vehicle to travel as intended and occupy both the first and second passage locations. This prevents two or more transport vehicles from coming into contact with one another in a particular segment, and also improves the overall transport efficiency of the article transport facility.

The article transport facility may preferably be configured such that
  the transport vehicle transmits a passage completion notification to the at least one segment controller after traveling past the first passage location or second passage location, and
  the at least one segment controller, after receiving the passage completion notification, ends the occupation by the transport vehicle of the first passage location or second passage location associated with the passage completion notification.

With the above configuration, the at least one segment controller, after receiving the passage completion notification, ends the occupation by the transport vehicle of the first passage location or second passage location associated with the passage completion notification. This allows a subsequent transport vehicle to be received by the first passage location or second passage location.

The article transport facility may preferably be configured such that
  the particular segment has, upstream from each of the first connection and the second connection, a stop location at which the transport vehicle stops if the transport vehicle has failed to receive the passage permission, and the transport vehicle requests the first passage permission or second passage permission from the at least one segment controller while traveling upstream from the stop location on the first route section or second route section.

The above configuration allows the transport vehicle to (i) stop at a stop location if the transport vehicle has failed to receive passage permission before reaching the stop location and (ii) avoid stopping and continue traveling if the transport vehicle has received passage permission at a position upstream from the stop location. This allows the transport vehicle to travel through the particular segment more efficiently.

The article transport facility may preferably be configured such that
  the particular segment has, upstream from the stop location on each of the first route section and the second route section, a deceleration subsegment in which the transport vehicle decelerates to stop at the stop location, and
  the transport vehicle, in response to receiving the passage permission while decelerating in the deceleration subsegment, starts to travel at a constant speed and then accelerates.

The above configuration causes the transport vehicle to, in response to receiving passage permission while decelerating in the deceleration subsegment, not start to accelerate immediately but start to travel at a constant speed before accelerating. This reduces a load on a travel driving source such as a motor.

The article transport facility may preferably be configured such that the particular segment has, upstream from the stop location on each of the first route section and the second route section: a first deceleration subsegment in which the transport vehicle decelerates to stop at the stop location; a constant-speed subsegment adjacent to and downstream from the first deceleration subsegment in which constant-speed subsegment the transport vehicle travels at a constant speed; and a second deceleration subsegment adjacent to and downstream from the constant-speed subsegment in which second deceleration subsegment the transport vehicle decelerates until the transport vehicle stops at the stop location.

The above configuration causes the transport vehicle to, before stopping at the stop location, decelerate in the first deceleration subsegment, travel at a constant speed in the constant-speed subsegment, and then decelerate in the second deceleration subsegment. As such, the above configuration involves a constant-speed subsegment, where the transport vehicle travels at a constant speed before stopping at the stop location. This ensures a relatively long time period for the transport vehicle to come to a full stop. If the transport vehicle receives passage permission before coming to a full stop, the transport vehicle is able to then avoid stopping and continue traveling, with the result of an improved transport efficiency.

The article transport facility may preferably further include:
  a higher controller, wherein
  the travel route is divided by a plurality of control zones,
  the plurality of control zones each include one or more of the particular segment,
  the at least one segment controller includes a plurality of segment controllers,
  the plurality of control zones each correspond to one of the plurality of segment controllers,
  the higher controller is configured to control the plurality of segment controllers, and
  in response to an inquiry from one of the plurality of segment controllers, the higher controller determines, based on whether the transport vehicle is present in a corresponding particular segment, whether the transport vehicle has traveled past the first passage location or second passage location.

The above configuration allows the segment controller to control the transport vehicle in the particular segment appropriately through cooperation with the higher controller.

INDUSTRIAL APPLICABILITY

The techniques in the present disclosure are applicable to an article transport facility including a transport vehicle configured to transport an article, a travel route on which the transport vehicle travels, and a segment controller configured to give passage permission to the transport vehicle traveling in a particular segment and control the transport vehicle, the particular segment covering a particular portion of the travel route.

The invention claimed is:
1. An article transport facility, comprising:
a transport vehicle configured to transport an article;
a travel route on which the transport vehicle travels; and
at least one segment controller configured to give passage permission to the transport vehicle traveling in a particular segment and control the transport vehicle, the particular segment covering a particular portion of the travel route,
wherein the particular segment covers:
  a first route section;
  a second route section that does not intersect with the first route section; and
  a connecting route section connecting a first connection on the first route section with a second connection on the second route section, and
wherein:
the first route section and the second route section are each a route section on which the transport vehicle travels in a single direction from upstream to downstream,
the first route section has a first passage location downstream from the first connection,
the second route section has a second passage location downstream from the second connection,
in a case where the transport vehicle travels past the first connection on the first route section;:
  the transport vehicle requests first passage permission from the at least one segment controller at a position upstream from the first connection, the first passage permission being the passage permission to travel past the first passage location,
  in response to receiving the first passage permission, the transport vehicle travels past the first connection toward the first passage location, and
  in response to failing to receive the first passage permission, the transport vehicle stops upstream from the first connection,
in a case where the transport vehicle travels past the second connection on the second route section;
  the transport vehicle requests second passage permission from the at least one segment controller at a position upstream from the second connection, the second passage permission being the passage permission to travel past the second passage location, in response to receiving the second passage permission, the transport vehicle travels past the second connection toward the second passage location, and in response to failing to receive the second passage permission, the transport vehicle stops upstream from the second connection, in a case where the at least one segment controller has given the first passage permission to the transport vehicle, the at least one segment controller permits the transport vehicle to occupy the first passage location associated with the first passage permission, in a case where the at least one segment controller has given the second passage permission to the transport vehicle, the at least one segment controller permits the transport vehicle to occupy the second passage location associated with the second passage permission, in a case where the transport vehicle travels from the first route section or second route section into the connecting route section, the transport vehicle requests both the first passage permission and the second passage permission from the at least one segment controller, and in response to the request for both the first passage permission and the second passage permission, the at least one segment controller, if the first passage location and the second passage location are both unoccupied by preceding transport vehicles, permits the transport vehicle to travel from the first route section or second route section into the connecting route section and to occupy both the first passage location and the second passage location.

2. The article transport facility according to claim 1, wherein:

the transport vehicle transmits a passage completion notification to the at least one segment controller after traveling past the first passage location or second passage location, and the at least one segment controller, after receiving the passage completion notification, ends the occupation by the transport vehicle of the first passage location or second passage location associated with the passage completion notification.

3. The article transport facility according to claim 1, wherein:

the particular segment has, upstream from each of the first connection and the second connection, a stop location at which the transport vehicle stops if the transport vehicle has failed to receive the passage permission, and the transport vehicle requests the first passage permission or second passage permission from the at least one segment controller while traveling upstream from the stop location on the first route section or second route section.

4. The article transport facility according to claim 3, wherein:

the particular segment has, upstream from the stop location on each of the first route section and the second route section, a deceleration subsegment in which the transport vehicle decelerates to stop at the stop location, and the transport vehicle, in response to receiving the passage permission while decelerating in the deceleration subsegment, starts to travel at a constant speed and then accelerates.

5. The article transport facility according to claim 3, wherein the particular segment has, upstream from the stop location on each of the first route section and the second route section:

a first deceleration subsegment in which the transport vehicle decelerates to stop at the stop location;

a constant-speed subsegment adjacent to and downstream from the first deceleration subsegment in which constant-speed subsegment the transport vehicle travels at a constant speed; and a second deceleration subsegment adjacent to and downstream from the constant-speed subsegment in which second deceleration subsegment the transport vehicle decelerates until the transport vehicle stops at the stop location.

6. The article transport facility according to claim 1, further comprising:

a higher controller, and wherein:

the travel route is divided by a plurality of control zones, the plurality of control zones each include one or more of the particular segment, the at least one segment controller includes a plurality of segment controllers, the plurality of control zones each correspond to one of the plurality of segment controllers, the higher controller is configured to control the plurality of segment controllers, and in response to an inquiry from one of the plurality of segment controllers, the higher controller determines, based on whether the transport vehicle is present in a corresponding particular segment, whether the transport vehicle has traveled past the first passage location or second passage location.

* * * * *

UNITED STATES PATENT AND TRADEMARK OFFICE
CERTIFICATE OF CORRECTION

PATENT NO. : 12,275,594 B2  
APPLICATION NO. : 18/224166  
DATED : April 15, 2025  
INVENTOR(S) : Toshihito Ueda et al.

Page 1 of 1

It is certified that error appears in the above-identified patent and that said Letters Patent is hereby corrected as shown below:

In the Claims

Column 20, Line 49, Claim 1, delete "section;:" and insert -- section: --

Column 20, Line 62, Claim 1, delete "section;" and insert -- section: --

Signed and Sealed this  
Tenth Day of June, 2025

Coke Morgan Stewart  
*Acting Director of the United States Patent and Trademark Office*